(12) United States Patent
Curiel Montoya et al.

(10) Patent No.: US 10,775,978 B2
(45) Date of Patent: Sep. 15, 2020

(54) ELECTRICAL ENCLOSURE WITH BUILT IN REMOTE INSPECTION AND VIRTUAL CONTROL OF SENSOR PLACEMENT

(71) Applicant: SCHNEIDER ELECTRIC USA, INC., Palatine, IL (US)

(72) Inventors: Carlos Eutimio Curiel Montoya, Monterrey (MX); Pablo Alejandro del Angel Marrufo, Monterrey (MX); Adrian Igor de Leon Sanchez, Monterrey (MX); Marcela Veronica Arizpe Rodriguez, Monterrey (MX); Jeffrey Owen Sharp, Murfreesboro, TN (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 997 days.

(21) Appl. No.: 14/505,795

(22) Filed: Oct. 3, 2014

(65) Prior Publication Data

US 2016/0100091 A1 Apr. 7, 2016

(51) Int. Cl.
*G06F 3/0484* (2013.01)
*G01R 31/00* (2006.01)

(52) U.S. Cl.
CPC ......... *G06F 3/04842* (2013.01); *G01R 31/00* (2013.01)

(58) Field of Classification Search
CPC .................................................. G06F 3/04842
USPC ....................................................... 348/143
See application file for complete search history.

(56) References Cited

U.S. PATENT DOCUMENTS

| 6,907,388 | B2 * | 6/2005 | Suzuki | ............. | G08B 13/19623 340/511 |
| 2010/0044567 | A1 * | 2/2010 | Brandt | .................. | G01J 5/0096 250/334 |
| 2011/0015816 | A1 * | 1/2011 | Dow | ...................... | G01C 21/20 701/23 |
| 2015/0006095 | A1 * | 1/2015 | Voisine | .................. | G01R 27/14 702/65 |

FOREIGN PATENT DOCUMENTS

EP 1535383 B1 4/2011
WO WO2004003497 A2 1/2004

* cited by examiner

*Primary Examiner* — Eileen M Adams
*Assistant Examiner* — Daniel T Tekle
(74) *Attorney, Agent, or Firm* — Locke Lord LLP

(57) ABSTRACT

A remote controllable monitoring system includes a movable sensor to monitor characteristic(s) of electrical components of equipment housed at different locations inside of an electrical enclosure. The movable sensor is movably mounted inside of the electrical enclosure. The monitoring system can also control the power supplied to the electrical components (e.g., turn power ON or OFF). A remote device interacts with the monitoring system to provide a user with remote control over the functions of the monitoring system. The remote device can include an interactive user interface with a virtual map of the electrical components. Accordingly, the user can monitor electrical components and turn OFF power to the electrical components if a problem or perspective problem is detected, via the interactive user interface of the remote device without opening or being near the electrical enclosure.

24 Claims, 12 Drawing Sheets

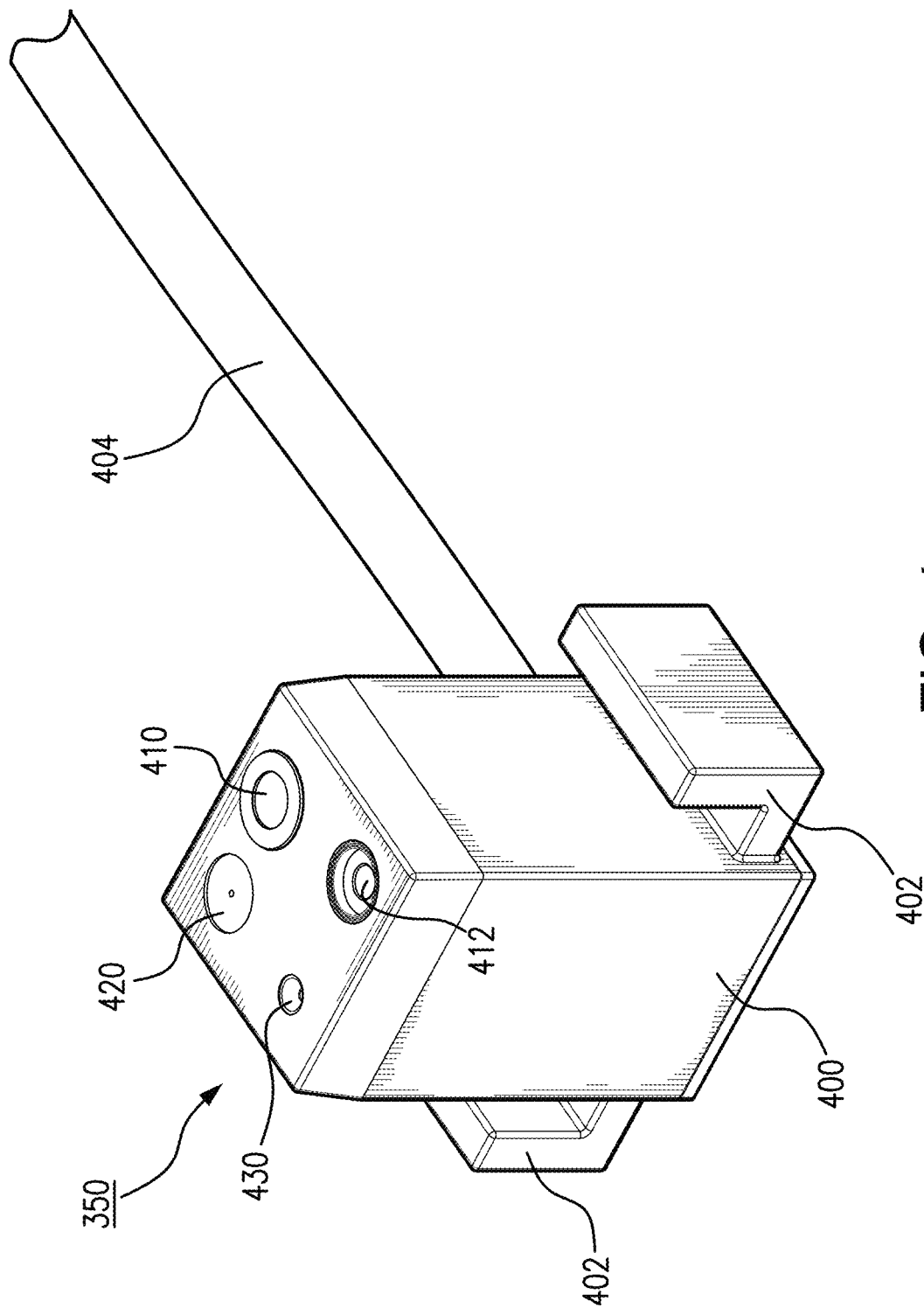

ELECTRICAL ENCLOSURE WITH BUILT IN REMOTE INSPECTION AND VIRTUAL CONTROL OF SENSOR PLACEMENT

FIELD

The present disclosure is related to a system and method of remotely monitoring electrical equipment inside of an electrical enclosure.

BACKGROUND

Power distribution systems utilize electrical equipment, such as a load center or panelboard, which may be housed in an electrical enclosure. The electrical equipment may include various electrical components, such as electrical devices (e.g., circuit breakers) and connectors. The electrical components are arranged at different locations inside of the enclosure. The electrical equipment is typically inspected to ensure that the various components are operating within normal parameters. The inspection may help to identify problems or potential problems, such mechanical or electrical overloads, or loose or broken electrical connections or components.

The equipment may be manually inspected by a person (e.g., human inspection) such as a technician. When conducting a manual inspection, the power to the enclosed equipment is turned off beforehand for safety reasons. However, turning off the power is a major inconvenience to some users, particularly those operating a business. Other inspection techniques can be used which allow monitoring of the equipment inside of the enclosure without having to open the enclosure or to turn off the power. For example, thermal imaging devices may also be used to capture thermal images of the equipment from outside of the enclosure. However, thermal imaging devices are very expensive and are typically operated by a person onsite.

There is a need to provide a user with greater flexibility and control over the monitoring of electrical equipment housed inside of an electrical enclosure, and over the control of power supplied to the equipment.

SUMMARY

A remote controllable monitoring system and method are disclosed, in which a user is able to remotely control the monitoring of electrical components housed at different locations inside of an electrical enclosure, via a movable sensor which is movably mounted inside of the enclosure. The monitoring system also allows a user to remotely control the power supplied to the electrical components, such as to turn power ON or OFF to the electrical components. The electrical enclosure may house a panelboard or a residential load center, which maintains electrical components such as circuit breakers, bus bars and connectors. The user can employ a remote device (e.g., tablet, smartphone or mobile computer) to interact with the monitoring system. The remote device can include an interactive user interface with a virtual map of the electrical components inside of the electrical enclosure. The user interface can be a user interface, which provides for interaction with the monitoring system via the Internet. Through the user interface, the user can control the operations of the monitoring system and monitor the electrical components inside of the electrical enclosure.

The monitoring system can include a processor, memory and communication device. The memory can store layout data identifying locations of electrical components inside the electrical enclosure. The communication device can provide for wireless or wireline communications with the remote device or other devices. The processor is configured to control movement of the movable sensor to a location relative to the location of an electrical component to be monitored according to a request from the remote device, and to monitor the electrical component with the movable sensor to sense one or more characteristics of the electrical component. The characteristics can include a temperature of the electrical component sensed by a temperature sensor (e.g., an infrared sensor), a physical appearance of the electrical component sensed by an image sensor (e.g., a camera), or other physical or chemical characteristics that are sensed using other types of sensors. The characteristics can also include a status of the electrical component based on an evaluation of the sensed characteristics (e.g., Normal, Abnormal, Overheating, etc.). The processor can transmit monitoring data relating to the sensed characteristics, such as in real time, to the remote device via the communication device. Through the remote device, the user can evaluate the monitored characteristics of any electrical component inside of the electrical enclosure and identify any problems or perspective problems with the components. The problems may include, for example, loose electrical conductors or connectors, flickering, reduced electrical performance, abnormal or inefficient power consumption, overload, unbalanced load, and so forth. The processor may also interrupt power to the electrical components via a power interrupter (e.g., a switch or relay) in response to a request (e.g., a power down request) from the remote device.

The monitoring system, in collaboration with the remote device, provides a safe and easy way for a user to monitor electrical components housed in an enclosure, and to control the power supplied to the electrical components from a remote location. The monitoring system can be controlled by the user, via the remote device, to perform a scheduled or routine monitoring of any of the electrical components such as for actual or predictive maintenance, or to perform monitoring at the user's request such as after an occurrence of an event (e.g., part replacement, initial installation, pilot run, earthquake, etc.). The remote device may offer such functionality through computer programs (e.g., an application program or app such as Internet-based application), which provide the interactive user interface through which to receive user commands, and to output monitoring data relating to sensed characteristic(s) of monitored electrical component(s) to the user. The user commands may include commands to set up a monitoring schedule or initiate a monitoring request for a desired component(s), or to turn ON or OFF the power to the electrical components.

BRIEF DESCRIPTION OF THE DRAWINGS

FIG. 4 illustrates an exemplary sensor holder of FIG. 4 which houses sensor(s) and other devices.

DETAILED DESCRIPTION OF THE EXAMPLE EMBODIMENTS

The present disclosure provides a remote controllable monitoring system, which allows a user to remotely monitor electrical components arranged at different locations inside of an electrical enclosure, without having to open the electrical enclosure or turn OFF power to the electrical components. The remote controllable monitoring system also allows a user to remotely turn ON or OFF power to the electrical components. The user can interact with the remote controllable monitoring system via a remote device, which provides an interactive user interface with a virtual map of the electrical components inside of the electrical enclosure.

Figure 1:
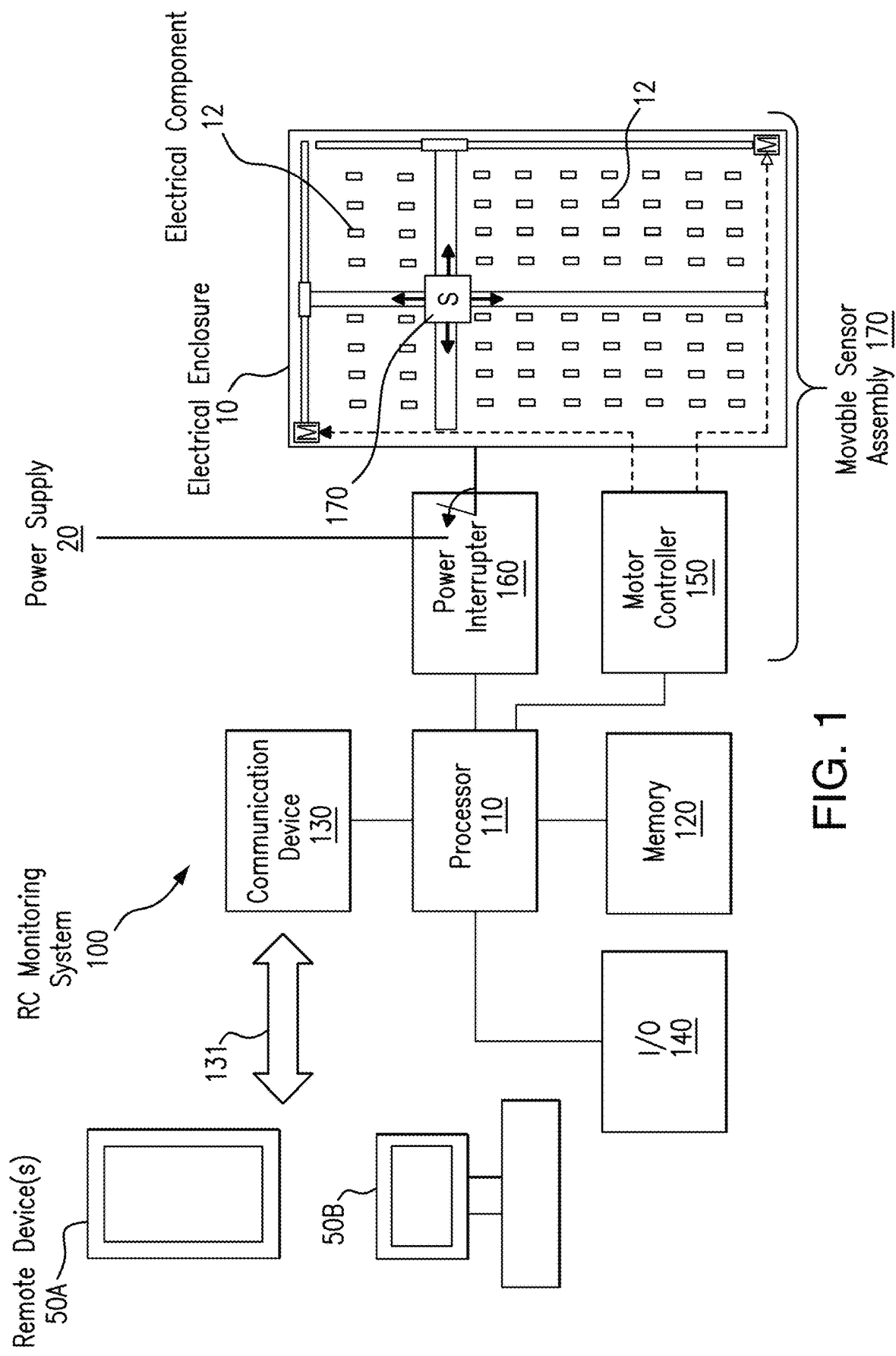
FIG. 1 illustrates a block diagram of an exemplary remote controllable monitoring system to monitor electrical components inside of an electrical enclosure.

Turning to the figures, FIG. 1 illustrates a remote controllable monitoring system 100 to monitor electrical components 12 of electrical equipment housed inside of an electrical enclosure 10. The electrical components 12 are arranged at different locations throughout the inside of the electrical enclosure 10. A user may remotely interact with the monitoring system 100 via a remote device 50. The remote device 50 can include an interactive user interface with a virtual map of the electrical components 12 inside of the enclosure 10. Through the remote device 50, the user can request monitoring of any of the electrical components 12 and receive monitoring data relating to sensed characteristic(s) of the electrical components 12 such as sensed temperature, sensed image(s) or video, and status notification (e.g., Normal, Abnormal, Overheating, etc.). The user can also remotely control the power to the electrical components 12 (e.g., turn ON or OFF) via the remote device 50.

The monitoring system 100 includes a processor 110, memory 120, communication device 130, motor controller 150, power interrupter 160 and movable sensor assembly 170 mounted inside of the electrical enclosure 10. The monitoring system 100 can also include input/output (I/O) devices 140, such as an input device (e.g., touch screen, keypad, etc.) to receive user commands to operate the monitoring system, and an output device (e.g., a display, speaker, etc.) to output information including the monitoring data relating to one or more sensed characteristics of the electrical components 12. The I/O devices can be lower power consumption devices. The monitoring system 100 can have various components, such as the processor 110, memory 120, the communication device 130 and the I/O devices 140, housed outside of the electrical enclosure 10 on an outer surface of the electrical enclosure 10 or in proximity to the electrical enclosure 10. The monitoring system 100 can be connected to or can include a power source (not shown) to supply power to the components of the monitoring system 100.

The processor 110 is a processing system, such as one or more microprocessors or microcontrollers, to control the functions and operations of the monitoring system 100. The processor 110 may perform various functions and operations according to instructions (e.g., executable computer program(s) or code(s)), which are stored in a storage medium or device such as the memory 120. In operation, the processor 110 can interact with the various components of the monitoring system 100 to control movement of sensor(s) of the movable sensor assembly 170 inside of the electrical enclosure 10, to monitor the electrical components 12 using the movable sensor(s) in order to sense one or more characteristics of the electrical components inside of the electrical enclosure, and to transmit monitoring data relating to the sensed characteristic(s) of the electrical components to the remote device 50. The processor 110 can also control the power interrupter 160 to turn power ON or OFF to the electrical components 12. The various operations may be implemented by the processor 110 in response to a request(s) from the remote device 50.

The memory 120 can include one or more memory devices, such as a random access memory (RAM), read only memory (ROM), flash or portable memory, solid-state memory, or a combination thereof. The memory 120 can store computer executable programs or codes, which when executed by the processor 110 controls the operations of the monitoring system 100. The memory 120 can also store various data to facilitate operation of the monitoring system 100, such as the monitoring data for the electrical components, monitoring schedules, notification settings, layout data of electrical components of electrical equipment, and so forth.

The communication device 130 can perform wireless and/or wireline communications with other remote devices and systems. The communication device 130 can include a transceiver (e.g., a transmitter and a receiver) to perform wireless and/or wireline communications over a network(s) 131, such as the Internet, local area network (LAN), wide area network (WAN), personal area network (PAN) and so forth. For wireless communications, the transceiver can include a radio frequency (RF) transmitter, receiver and antenna. Wireless communication can be conducted using WiFi, ZigBee, Bluetooth, etc.

The power interrupter 160 can be connected upstream to the equipment, such as between a power supply 20 and the electrical components 12 of the electrical equipment housed inside of the electrical enclosure 10, and operated to turn power ON or OFF to the electrical components 12. The power interrupter 160 can be a controllable circuit breaker such as a SQUARE D brand POWERLINK circuit breaker, relays, contactors, solid state switches or other controllable switching mechanism to interrupt and/or connect power, such as from the power supply 20, to the electrical components 12.

The movable sensor assembly 170 includes a frame which is mounted inside of the electrical enclosure 10, and one or more movable sensors which move on or along the frame. The movable sensor(s) can be moved to a location relative to any electrical component 12 to be monitored inside of the electrical enclosure 10. In this example, the movable sensor assembly 170 is a motor-driven system, which includes a sensor holder (e.g., a sensor header) with sensor(s) S, motor(s) M and a frame (e.g., a rail system). The sensor holder can be driven by the motor(s), directly or indirectly, to move on or along the frame to different locations inside of the electrical enclosure 10, such as in a two-dimensional (2-D) space (e.g., x and y coordinates) or a three-dimensional (3-D) space (e.g., x, y and z coordinates). The sensor holder may include sensors such as a temperature sensor (e.g., infrared sensor), an image sensor (e.g., a still or video camera, a thermal imaging sensor, etc.), an electro-optical sensor, a laser (e.g., a laser pointer) and other devices, such as a light source (e.g., light emitting diode (LED)). An example of the movable sensor assembly 170 and its sensor holder is described in greater detail below with reference to FIGS. 3 and 4.

Figure 2:
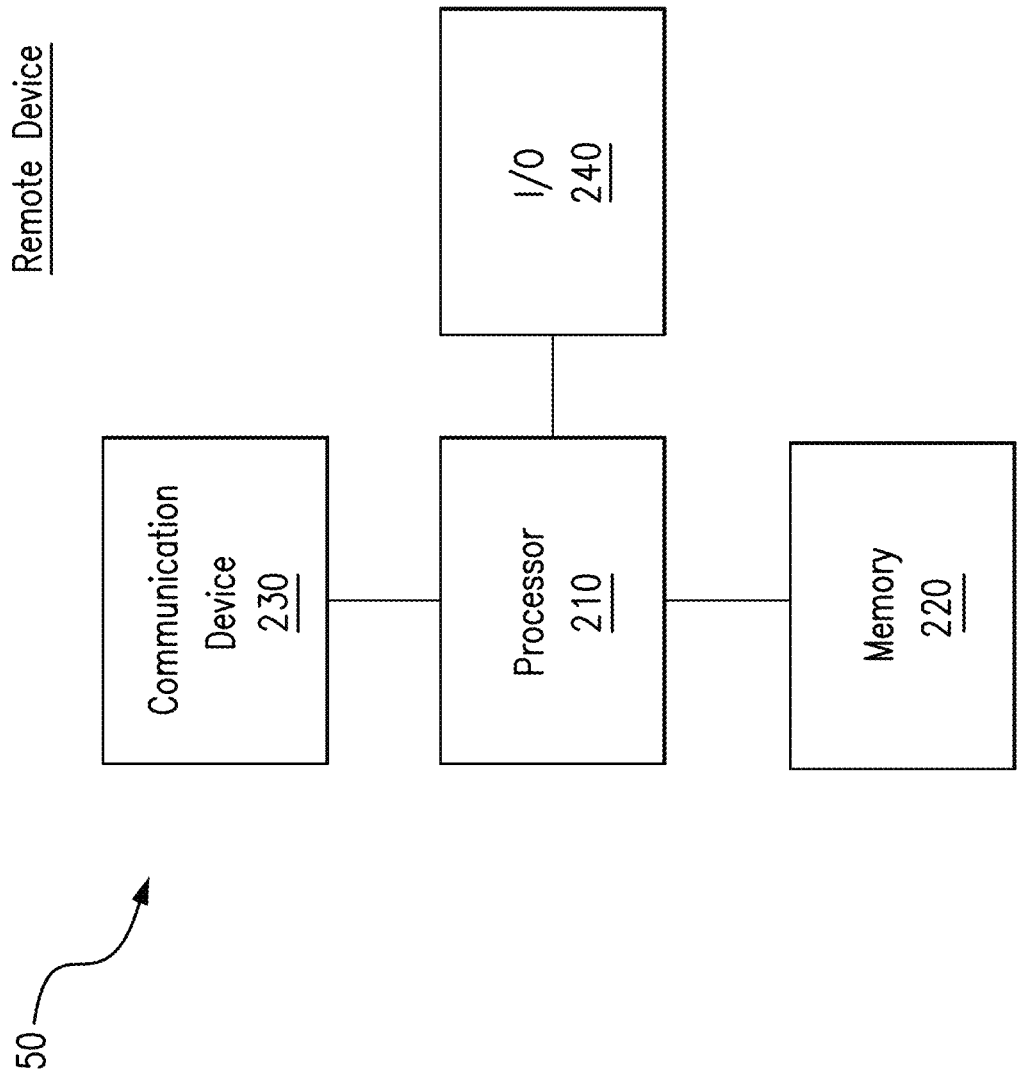
FIG. 2 illustrates a block diagram of exemplary components of a remote device through which a user can interact with the remote controllable monitoring system of FIG. 1.

FIG. 2 illustrates a block diagram of example components of the remote device 50 in FIG. 1. The remote device 50 allows a user to interact with and control the monitoring system 100 to perform monitoring and other functions described herein. The remote device 50 can be a tablet computer, mobile computer, smartphone, remote controller or other computing system with communications capability.

As shown in FIG. 2, the remote device 50 can include a processor 210, memory 220, communication device 230 and input and output (I/O) devices 240. The processor 210, memory 220 and communication device 230 may generally be of the same type as the processor 110, memory 120 and communication device 130 (as previously described for FIG. 1), except that the processor 210 interacts with the various components of the remote device 50 to allow the user to remotely control the operations of the monitoring system 100 and to remotely monitor any of the electrical components 12, via an interactive user interface. The interactive user interface can include an interactive virtual map of the electrical components 12 inside of the electrical enclosure 10 (such as in FIG. 1). The user interface can be a Web- or Internet-based user interface, which provides for interaction with the monitoring system via the Internet. The I/O devices 240 can include input devices such as a touch screen, touch pad, mouse, keyboard and microphone for receiving user commands, and output devices such as a display and speaker. The remote device 50 can be connected to or can include a power source (not shown) to supply power to the components of the remote device.

Figure 3:
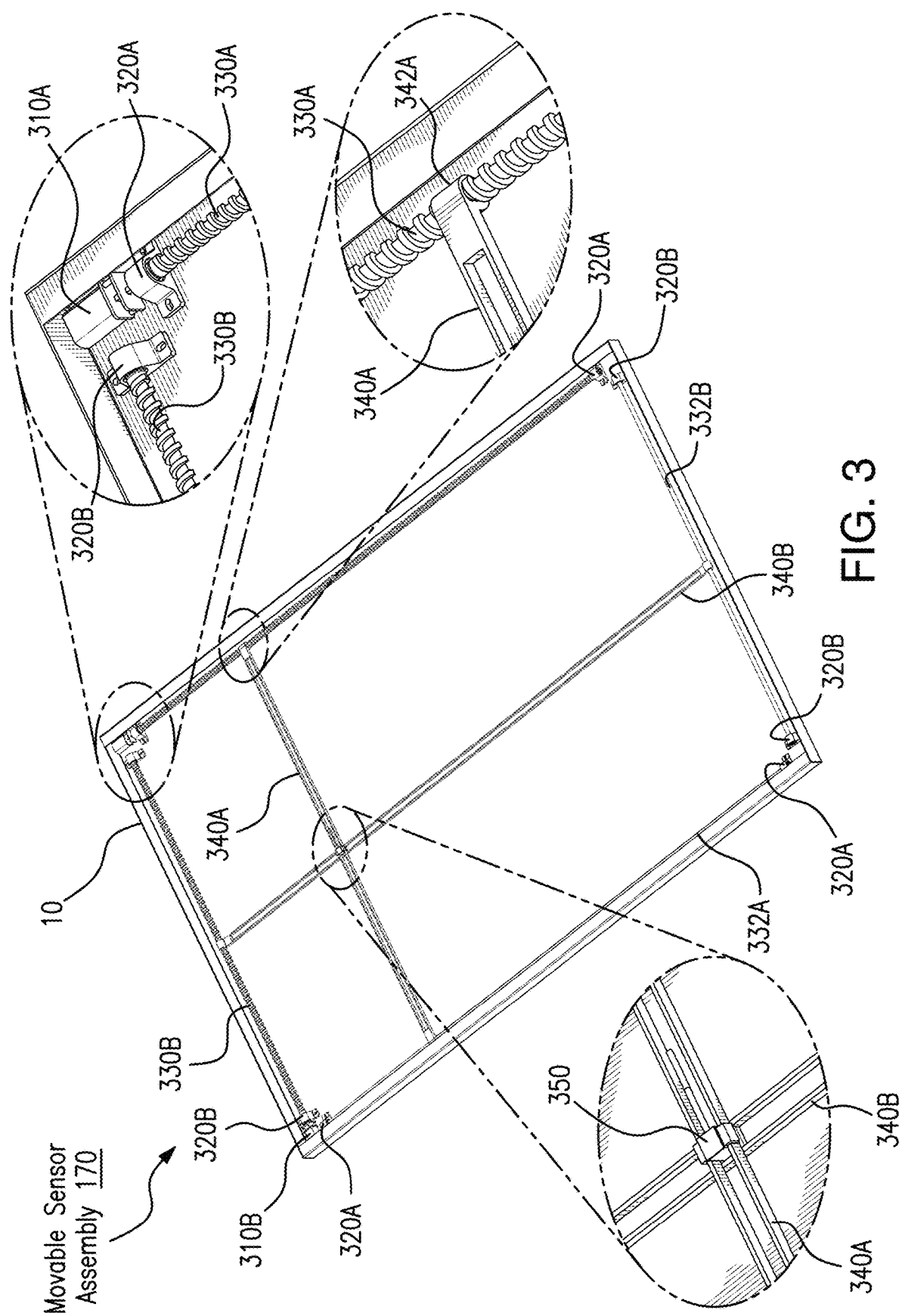
FIG. 3 illustrates an exemplary movable sensor assembly with a sensor holder of the monitoring system of FIG. 1.

FIG. 3 illustrates an example of the movable sensor assembly 170 with a sensor holder 350 which moves along or on a frame that is mounted inside of the electrical enclosure 10 (which is partially shown). In this example, the sensor holder 350 is movable in a two-dimensional space (e.g., horizontal (x), vertical (y)) defined by a frame, which is mounted on an interior side of a wall or panel of the electrical enclosure 10.

The frame includes a first frame assembly to move the sensor holder 350 along a vertical direction (e.g., y-axis) and a second frame assembly to move the sensor holder 350 along a horizontal direction (e.g., x-axis). The first frame assembly includes a motor 310A, bearings 320A, elongated worm gear 330A, first rail 340A with a central channel and a rod 332A. The worm gear 330A has opposing first and second ends with a portion therebetween that is threaded. The worm gear 330A is rotatably mounted onto one end of a shaft of the motor 310A. Each of the first and second ends of the worm gear 330A is rotatably engaged in a respective bearing 320A, which is connected to the interior panel or wall of the electrical enclosure 10. The rod 332A is arranged substantially parallel to the worm gear 330A, and also has opposing ends which are engaged to respective bearings 320A. The first rail 340A includes two opposing end portions 342A and a central channel that extends along a length (or longitudinal axis) of the first rail 340A between the two end portions 342A. Each end portion 342A includes a hole, which extends along a width of the first rail (e.g., an axis transverse to the longitudinal axis) therethrough. The first rail 340A has one of the two end portions 342A movably mounted on the worm gear 330A and the other of the two end portions 342A movably mounted on the rod 332A, via the holes of the end portions 342A. The hole of the end portion 342A, which is engaged to the worm gear 330A, is threaded so that the first rail 340A moves along the vertical direction when the worm gear 330A is driven by the motor 310A to rotate in a clockwise or counter-clockwise direction.

Similar to the first frame assembly, the second frame assembly includes a motor 310B, bearings 320B, elongated worm gear 330B, second rail 340B with a central channel, and rod 332B. The components of the second frame assembly are basically configured in the same manner described for the corresponding components of the first frame assembly, except that they are oriented differently, e.g., shifted about 90 degrees, to move the second rail 340B along a horizontal direction. In this example, the first rail 340A is arranged below the second rail 340B.

The sensor holder 350 is arranged inside the channels of both the rail 340A and the rail 340B at an intersection between the two rails 340A and 340B. The motors 310A and 310B can be driven via a motor controller (e.g., the motor controller 150 in FIG. 1) to move the sensor holder 350 to a desired location in a two dimensional space inside of the electrical enclosure 10 by moving the first rail 340A in a vertical direction and/or the second rail 340B in a horizontal direction.

FIG. 4 illustrates an example sensor holder 350 (e.g., a sensor header) which includes a housing 400 to house various devices, such as one or more sensors and other devices. The sensor holder 350 also includes two arm supports 402 which extend from opposite sides of the housing 400. In this example, each arm support 402 has an L-shape. The arm supports 402 are movably engaged to respective opposite sides of the first rail 340A or the second rail 340B (whichever is on the bottom), when the sensor holder 350 is arranged inside the channels of the first and second rails 340A and 340B, such as shown in FIG. 3.

As further shown in FIG. 4, the sensor holder 350 can include a plurality of sensors to monitor one or more characteristics of the electrical components, such as the electrical components 12 inside of the electrical enclosure 10 (as shown in FIGS. 1 and 3). The sensors can include a temperature sensor 410 (e.g., infrared sensor), an image sensor 412 (e.g., a still or video camera) or other sensors to detect physical or chemical properties of the electrical components. For example, the sensors can also include an electro-optical sensor for measuring electrical field around an electrical component or a moisture sensor. As such, the sensor holder 350 can include sensors or combination of sensors other than or in addition to a thermal or image sensor.

The sensor holder 350 can also include a laser 420 (e.g., a laser pointer) and a light source 430 (e.g., an LED). The laser 420 can be used to point to a monitored electrical component or an electrical component to be monitored by the sensor(s). The light source 430 can be used to light an interior of the electrical enclosure, and provide sufficient lighting when capturing an image(s) or video of electrical components using the image sensor 412. The sensor holder 350 can include a cable(s) 404 to supply power to the sensors and other devices, and to communicate information between the components of the sensor holder 350 and the other components of the monitoring system 100 (in FIG. 1).

The information can include commands which are transmitted to the sensors and other components of the sensor holder 350. The information can also include signals relating to the sensed characteristics transmitted from the sensors.

Figure 5A:
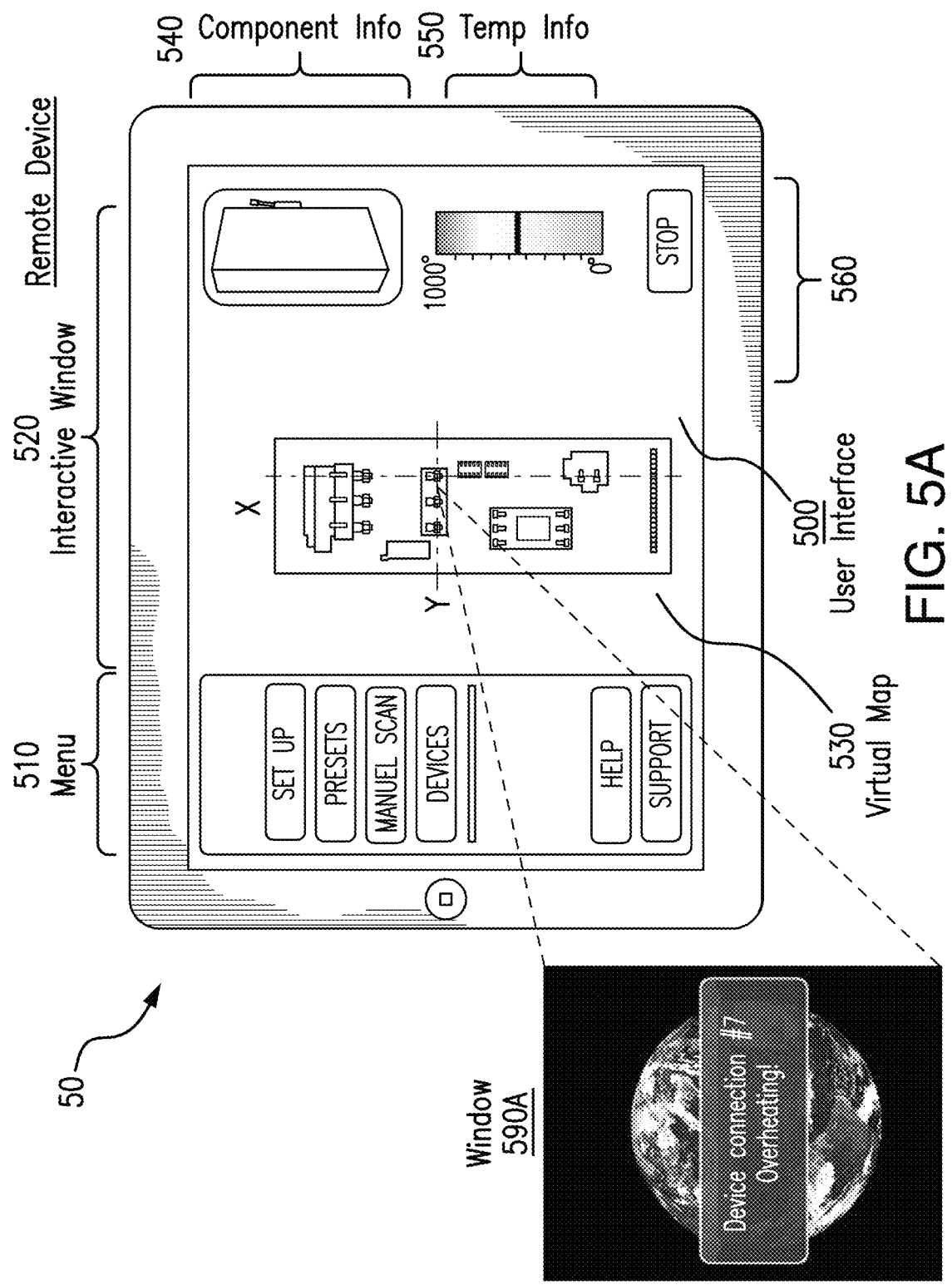
FIG. 5A illustrates an exemplary remote device of FIG. 1 having an interactive user interface with a virtual map of electrical components that are housed inside of the electrical enclosure in accordance with an embodiment of the present disclosure.

FIG. 5A illustrates a remote device, such as the remote device 50 in FIG. 1, displaying an exemplary interactive user interface 500. The user interface 500 includes a menu 510 and an interactive window 520. The interactive window 520 includes a virtual map 530 of electrical components of electrical equipment that is housed inside of an electrical enclosure, component information 540, sensed information 550 such as temperature information, and other graphical input element(s) 560 such as a Stop input button, or other input elements.

In this example, the menu 510 provides the user with access to various functions, such as Setup, Presets, Manual Scan, Devices, Help and Support, and may include other functions. The Setup function can initiate a process by which the user can set up or update remote monitoring functions for new electrical equipment or existing monitored electrical equipment. This may include downloading layout data (including images) for electrical components of the equipment housed inside of an electrical enclosure, and synchronizing the layout of the electrical components on the virtual map 530 with actual locations in the electrical enclosure for monitoring purposes. The layout data can include images of the electrical components, component identifiers identifying electrical components, and location information identifying their location in the equipment. The layout data can be downloaded from a remote server, such as operated by or on behalf of a third party (e.g., the equipment manufacturer), at a remote location.

The Preset function can initiate a process by which the user can configure monitoring settings. The monitoring settings can include a monitoring schedule for selected or all electrical components. The monitoring settings can also include notification settings to provide a notification when a predefined condition is detected, when monitoring the electrical components of the equipment. The user can set threshold(s) to define conditions in which the monitoring system 100 will notify the user via the remote device 50. For example, the monitoring system 100 may be configured to notify the remote device 50, when a temperature of an electrical component satisfies a predefined condition, e.g., greater than or equal to a threshold temperature or falls within a temperature threshold range.

The Manual Scan function can initiate a process by which a user can begin a manual monitoring session, in which the user can navigate and select any electrical component through the virtual map 530 for real time monitoring. In the Manual Scan mode, the user can move the sensor holder (e.g., in FIGS. 3 and 4) to a relative position to monitor a specific electrical component via the virtual map 530, and receive real time monitoring data such as a live image or video feed of the electrical component and live data relating to other sensed characteristics, such as temperature, from the sensor(s) on the sensor holder.

The Devices function can initiate a process by which a user can select particular equipment to be monitored from a plurality of equipment having electrical components. For example, the remote device 50 may interact with a plurality of monitoring systems 100 which are monitoring different equipment, e.g., a load center #1, load center #2, etc.

Turning to the interactive window 520, the virtual map 530 displays a virtual layout of selected or all electrical components of the electrical equipment inside of the electrical enclosure. The virtual layout of the electrical components on the virtual map 530 is synchronized with actual locations inside of the electrical enclosure. Thus, the virtual map 530 allows the user to navigate through the different electrical components, and select a desired electrical component to implement real time monitoring of the electrical component via the monitoring system 100. An electrical component can also be selected on the virtual map 530 in order to obtain or output historical monitoring data for the electrical component from the monitoring system 100.

The component information 540 identifies the monitored equipment or one of its electrical components, and can include an image and description thereof. The component information 530 can also be selected by the user to obtain a more detailed description of the overall equipment or its electrical components.

The sensed information 550 displays information relating to one or more sensed characteristics of an electrical component. In this example, the sensed information 550 provides temperature information in the form of a color coded bar graph for the sensed temperature of an electrical component in Kelvins (e.g., 0 to 1000 degrees Kelvin). The sensed temperature is at the higher end of the bar graph, which indicates that the electrical component may be overheating.

The graphical input elements 560 provide additional functions related to the interactive window 520. In this example, the graphic input element 560 includes a graphical STOP button for use in terminating a user session for monitoring the selected equipment through the remote device 50.

In operation, as shown in FIG. 5A, the user may select an electrical component from those shown on the virtual map 530 to check on a status of the specific electrical component. The electrical component as shown on the virtual map 530 may be highlighted in some manner (e.g., different color, flashing or not flashing, etc.) according to a detected status of the electrical component when certain predefined conditions are detected (or not) at the monitoring system 100 or the remote device 50 through the evaluation of the monitoring data. The status may include a normal state (Normal), abnormal state (Abnormal) or a specific description of the abnormal state. In this example, the highlighted electrical component is selected, which causes the remote device to open a new window 590A. The new window 590A provides details of the particular detected condition of the electrical component. For example, the electrical component, which is identified as device connection #7, is operating abnormally, namely Overheating.

The user interface 500 can provide for interaction with the monitoring system via the Internet. The user interface 500 and its functions can be provided through a Web-based application program, or a mobile application program running on the remote device 50.

Figure 5B:
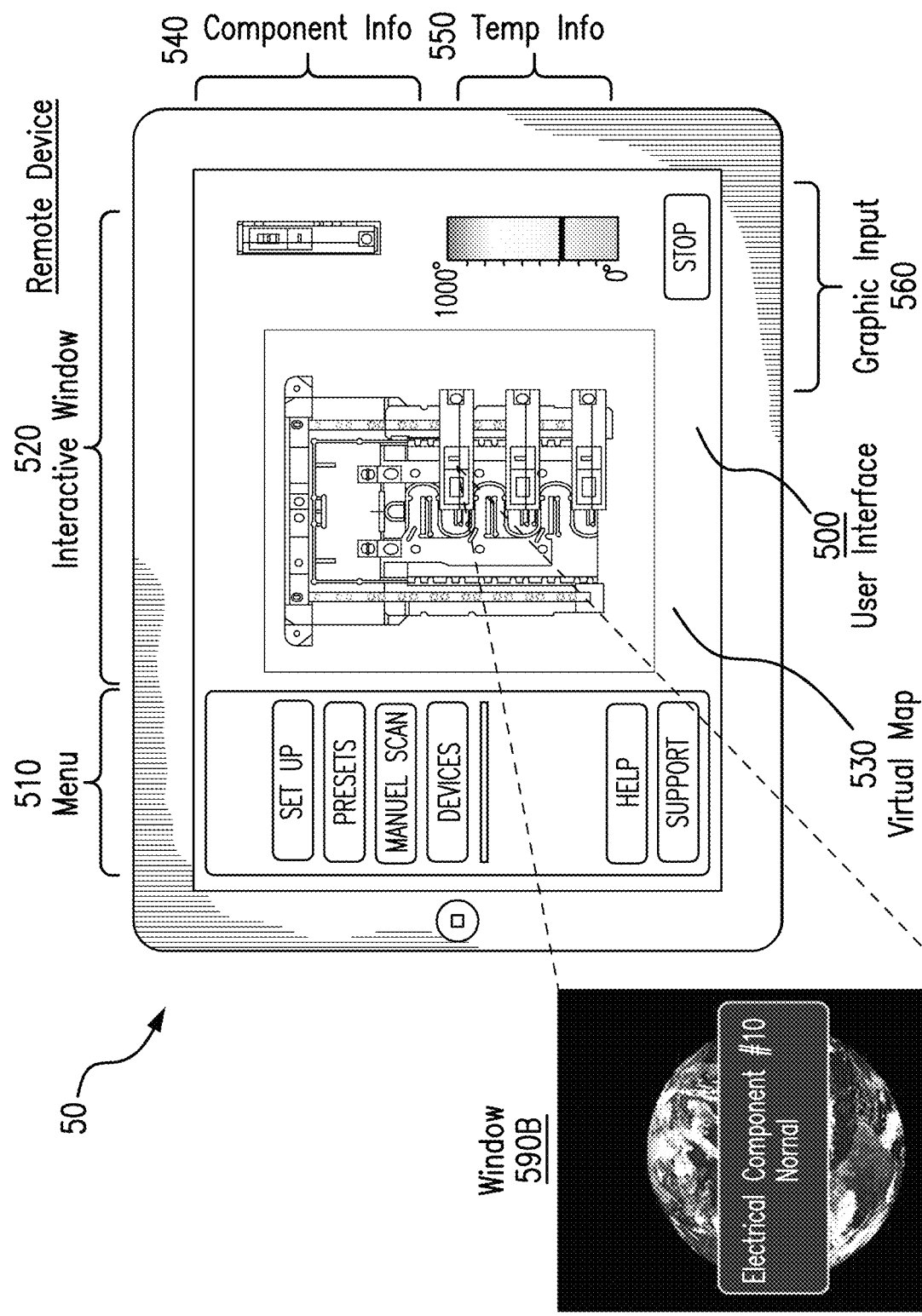
FIG. 5B illustrates an exemplary remote device of FIG. 1 having an interactive user interface with a virtual map of different electrical components than those shown in FIG. 5A in accordance with a further embodiment of the present disclosure.

FIG. 5B illustrates the remote device 50, with a different type of equipment displayed on the interactive user interface 500 than shown in FIG. 5A. In this example, the equipment is a panelboard or load center with electrical components, such as bus bars, circuit breakers and connectors. The component information 540 shows an image of the selected electrical component, which in this case is a circuit breaker. The sensed information 550 reflects that the sensed temperature of the circuit breaker is within normal parameters. As further shown, the electrical component, such as the circuit breaker, is selected via the virtual map 530 to open a window 590B. In the window 590B, the selected electrical component, which is described as electrical component #10, is operating normally (Normal).

Although the remote device 50 is shown as a tablet computer in FIGS. 5A and 5B, the user interface 500 can be implemented on other types of remote devices 50 (e.g., a mobile computer, smartphone, etc.). The size, shape, color and layout of the graphical elements of the user interface 500 shown in FIGS. 5A and 5B can also be varied.

Figure 6:
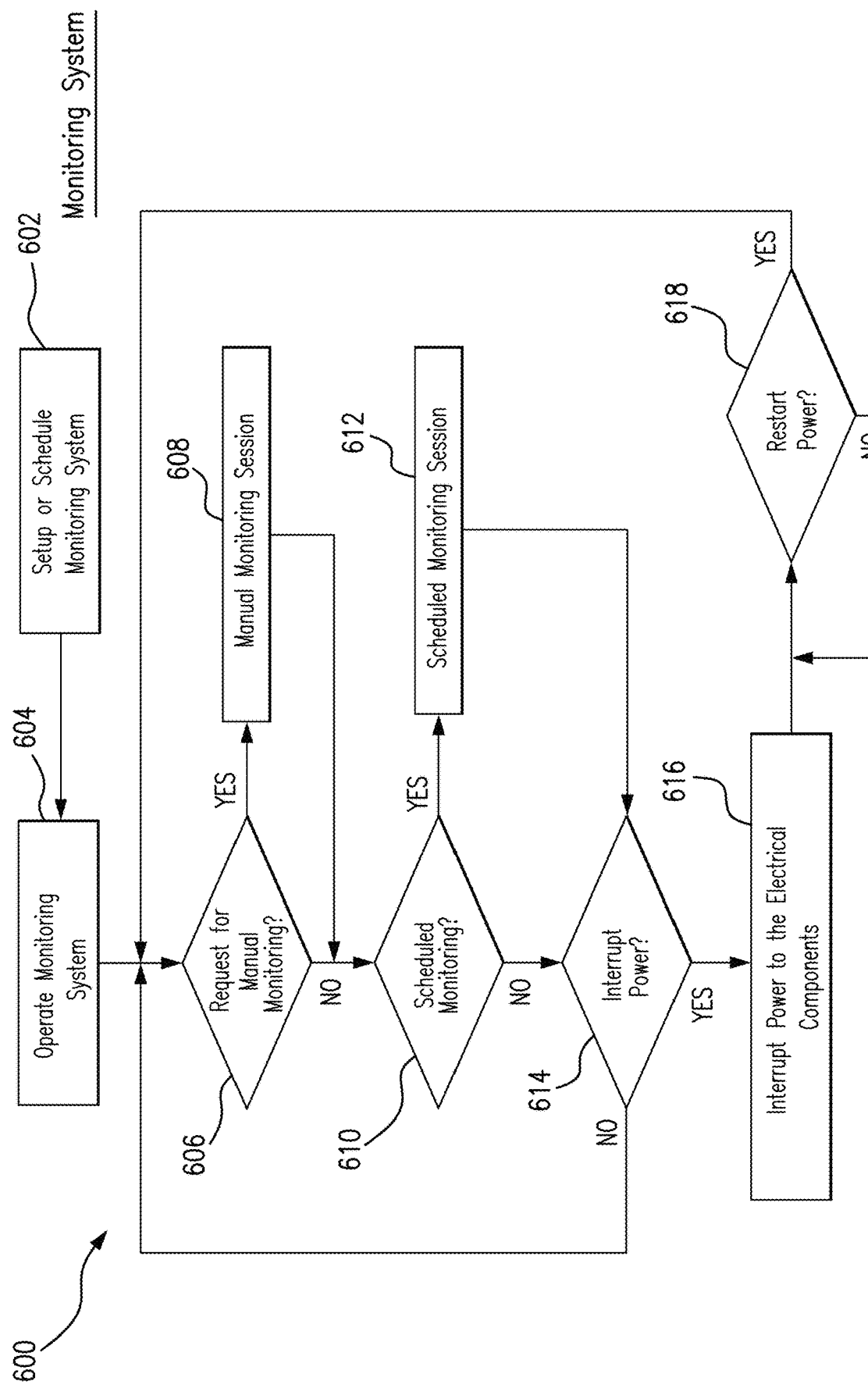
FIGS. 6, 7 and 8 illustrate exemplary processes implemented by the components of a remote controllable monitoring system, such as the monitoring system in FIG. 1, in accordance with an embodiment of the present disclosure.
Figure 7:
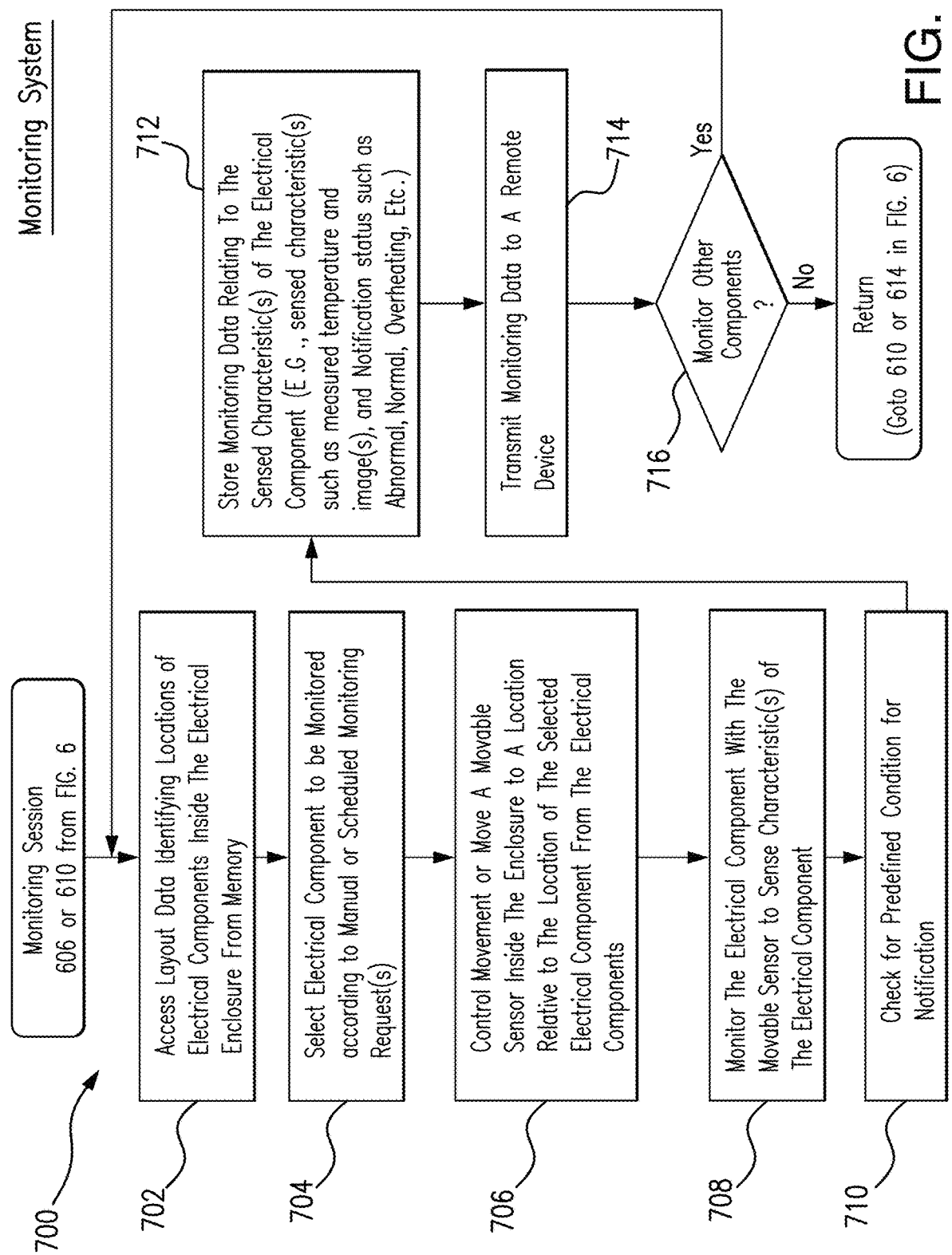
Figure 8:
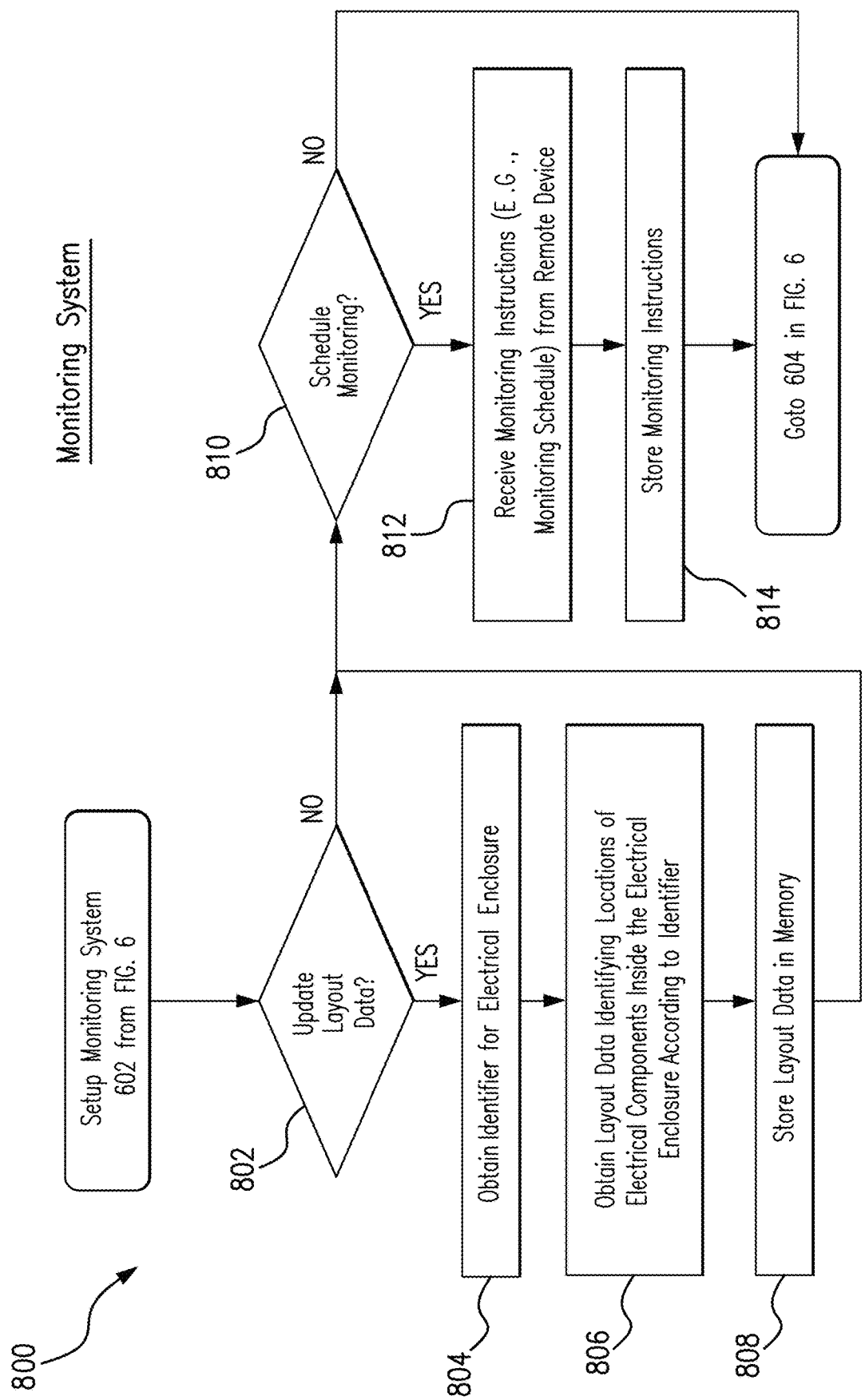

FIGS. 6, 7 and 8 illustrate exemplary processes implemented by a remote controllable monitoring system, such as the monitoring system 100 in FIG. 1, to monitor electrical components of electrical equipment which is housed inside of an electrical enclosure and to control power supplied to the electrical components. The various operations can be implemented under control of a processor, which interacts with other components of the monitoring system, such as a communication device, memory, power interrupter, motor controller and/or a movable sensor assembly with movable sensor(s).

FIG. 6 illustrates an exemplary process 600 implemented by the monitoring system to monitor the electrical components and to control power supplied to the electrical components. As shown, the process 600 begins with setting up or scheduling the monitoring system to monitor electrical components of electrical equipment inside of an enclosure at reference 602. The setup operations can include a setup session to obtain and store layout data of the electrical components of the electrical equipment to be monitored. The scheduling operations can include a scheduling session to receive one or more scheduling requests from a remote device. Each scheduling request can include monitoring instructions to monitor one, selected or all electrical components according to a predefined schedule, and can also include notification settings. The notification settings are used to define conditions under which a remote device of the user is notified when monitoring the electrical components. An example of the setup and scheduling operations are described further below with reference to FIG. 8.

At reference 604, the monitoring system is ready to perform the monitoring and power control operations. At reference 606, the monitoring system determines whether a request for a manual monitoring session has been received from the remote device. If so, the monitoring system implements a manual monitoring session in response to the monitoring request at reference 608. During the manual monitoring session, the monitoring system controls the movement or moves one or more movable sensors to sense characteristic(s) of one or more electrical components according to a manual request(s) received from the remote device. As used herein, a manual request is a request by a user via the remote device to monitor one or more electrical components in real time during a manual monitoring session. The monitoring system can also determine if any predefined condition for notification has occurred based on the sensed characteristic(s) of the electrical component. The monitoring system can store monitoring data related to the sensed characteristic(s) of the electrical component, and transmit monitoring data in real time or at a later time to the remote device.

During the manual monitoring session, manual requests can be initiated by the user through a virtual map on an interactive user interface on the remote device. The user can navigate the virtual map, select a desired electrical component for monitoring on the virtual map, and receive real time electrical monitoring data, such as a live video feed of the electrical component, a current measured characteristic(s) of the electrical component, and/or a status notification of the electrical component based on the sensed characteristic(s). An example of monitoring session operations is described further below with reference to FIG. 7.

If a manual monitoring session was not requested or has been completed, the monitoring system determines whether a scheduled monitoring session is to be performed based on previously received scheduling request(s) at reference 610. If so, the monitoring system implements a scheduled monitoring session, at reference 612. The scheduling monitoring session can be implemented in a similar manner as the manual monitoring session (described above), except that the selection of electrical components to be monitored as well as other parameters for the monitoring session (e.g., storage and transmission of monitoring data) may have been predefined by the scheduling request(s) or the notification settings.

If a scheduled monitoring session is not to be performed or has been completed, the monitoring system determines whether a power down request has been received from the remote device at reference 614. If not, the process 600 proceeds back to reference 606. Otherwise, at reference 616, if a power down request is received, the monitoring system interrupts, e.g., turns OFF, power to the electrical components via the power interrupter.

At reference 618, the monitoring system determines whether a power up request has been received from the remote device. If a power up request is received, the monitoring system connects, e.g., turns ON, power to the electrical components via the power interrupter. Thereafter, the process 600 returns to reference 606.

FIG. 7 illustrates a process 700 by which the monitoring system implements a monitoring session, such as a manual monitoring session at reference 608 or a scheduled monitoring session at reference 612 of FIG. 6.

At reference 702, the monitoring system accesses layout data stored in a memory. The layout data identifies locations of electrical components of equipment inside of the electrical enclosure. The locations can be expressed in Cartesian coordinate system (e.g., x and y for 2-D, and x, y and z for 3-D) or other suitable coordinate system.

At reference 704, the monitoring system selects an electrical component to be monitored from a plurality of electrical components according to a manual or scheduling request depending on the type of monitoring session. At reference 706, the monitoring system controls movement or moves a movable sensor (e.g., sensor(s) housed in a sensor holder), inside the electrical enclosure to a location relative to the location of the selected electrical component. The monitoring system can control the movement of the movable sensor based on the electrical component identified in the manual or scheduling request (e.g., component identifier) and the layout data. Alternatively, the manual or scheduling request can include location information, e.g., coordinates related to the selected electrical component, which can be used by the monitoring system to control the movement of the movable sensor.

At reference 708, the monitoring system monitors the electrical component using the movable sensor to sense one or more characteristics of the electrical component. The characteristics can include physical or chemical properties, such as a temperature of the electrical component (via a temperature sensor), image or video (via an image sensor) or other properties (via other types of sensors).

At reference 710, the monitoring system evaluates the sensed characteristic(s) to determine if a predefined condition for notification has been detected. For example, the monitoring system transmits a status notification to the remote device indicating that the electrical component is in an abnormal state or is overheating or in danger of overheating if the sensed temperature of the electrical component exceeds or is equal to a temperature threshold or satisfies a temperature threshold range. As previously discussed, the predefined condition for notifications can be setup in advance by a user through the remote device for each and every electrical component.

At reference 712, the monitoring system stores monitoring data relating to the sensed characteristic(s) of the electrical component. The monitoring data can include information relating to sensed characteristic(s) of the electrical components, such as one or more sensed characteristics (e.g., temperature, image(s) or video, or other detected property of the electrical component), status of the electrical component (e.g., Abnormal, Normal, Overheating, etc.), time stamp (e.g., date and time) and other relevant information concerning the monitoring operation of the electrical component.

At reference 714, the monitoring system transmits the monitoring data to the remote device.

At reference 716, the monitoring system determines whether there are other electrical components to monitor. For a manual monitoring session, the monitoring system checks for additional manual requests to monitor other electrical components of equipment housed in the electrical enclosure. For a scheduled monitoring session, the monitoring system determines if there are other electrical components that are scheduled for monitoring according to scheduling requests. If there are other electrical components to monitor, the process 700 proceeds back to reference 702 to begin the process of selecting another electrical component for monitoring. Otherwise, if not, the process 700 and proceeds to either reference 610 in FIG. 6 after a manual monitoring session or reference 614 in FIG. 6 after a scheduled monitoring session.

FIG. 8 illustrates an exemplary process 800 by which the monitoring system implements a setup session and/or a scheduling session, such as initiated at reference 602 in FIG. 6.

As shown in FIG. 8, at reference 802, the monitoring system checks whether to retrieve new layout data for new equipment to be monitored or updated layout data for existing monitored equipment. If so, the monitoring system obtains equipment identification information (e.g., equipment identifier) for the equipment to be monitored at reference 804. At reference 806, the monitoring system then obtains the new or updated layout data which identifies the electrical components of the equipment and their locations based on the equipment identification information. The monitoring system can communicate with a remote system (e.g., a remote server) to request and download layout data for the specified equipment from a remote location. The layout data may include an image of the equipment and other relevant data, such as the identity and location of the electrical components. The remote server can be operated by a third party, such as by or on behalf of the equipment manufacturer. At reference 808, the monitoring system stores the layout data of the equipment in a memory.

The process 800 continues to reference 810, in which the monitoring system determines whether to add or update a monitoring schedule for the electrical components, such as in response to a scheduling request from the remote device. If so, the monitoring system opens a scheduling session to receive a scheduling request from the user via the remote device, at reference 812. The scheduling request can include monitoring instructions concerning a monitoring schedule(s) for selected or all electrical components of the equipment. The monitoring instructions can also include notification settings for notifying the user, such as via the remote device, of an occurrence of a predefined condition (e.g., overheating or broken electrical component). At reference 814, the monitoring system stores the monitoring instructions in the memory. Thereafter, the process 800 proceeds to reference 604 in FIG. 6 (previously described above).

Figure 9:
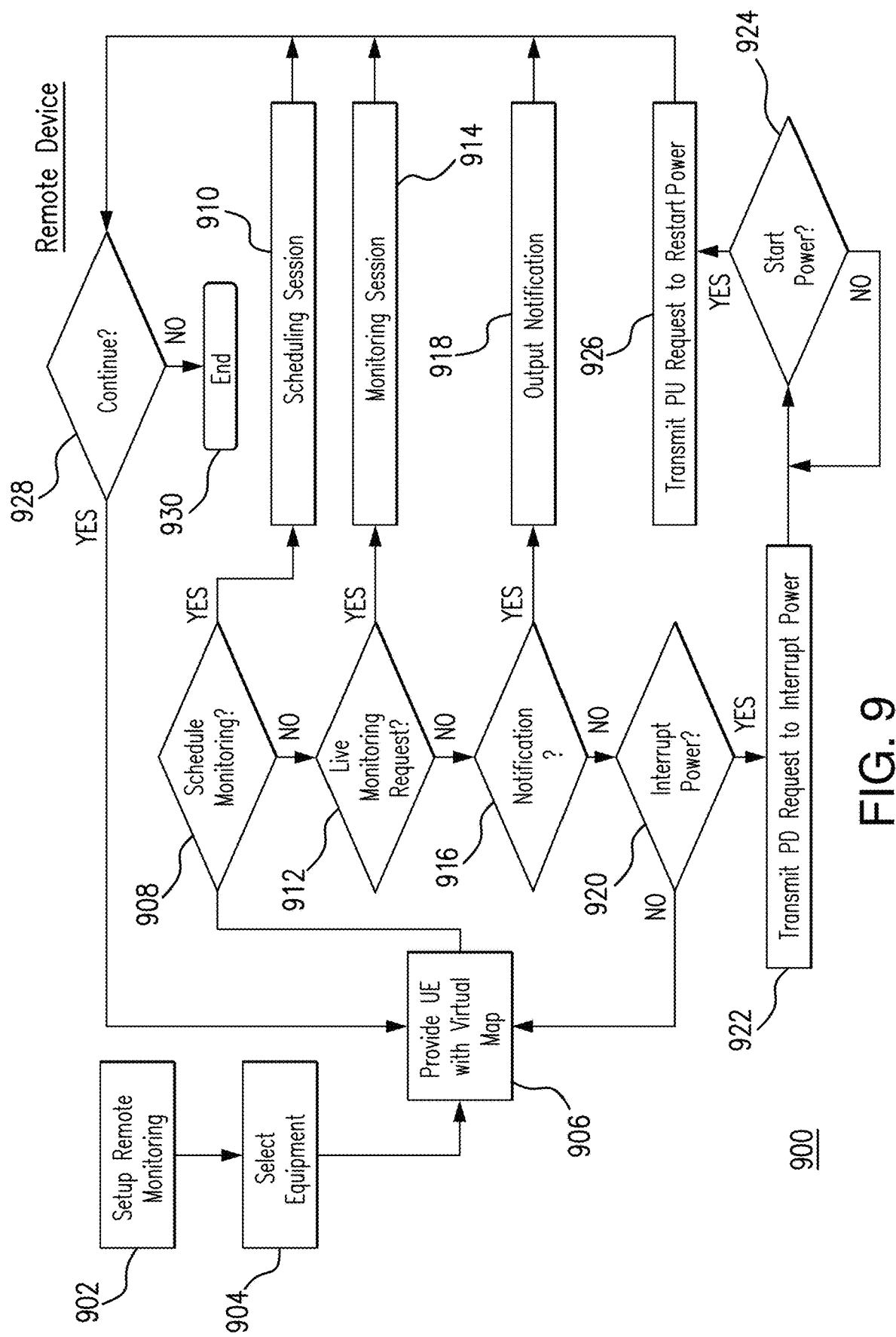
FIGS. 9, 10 and 11 illustrate exemplary processes implemented by the components of a remote device, such as the remote device in FIG. 1, in accordance with an embodiment of the present disclosure.
Figure 10:
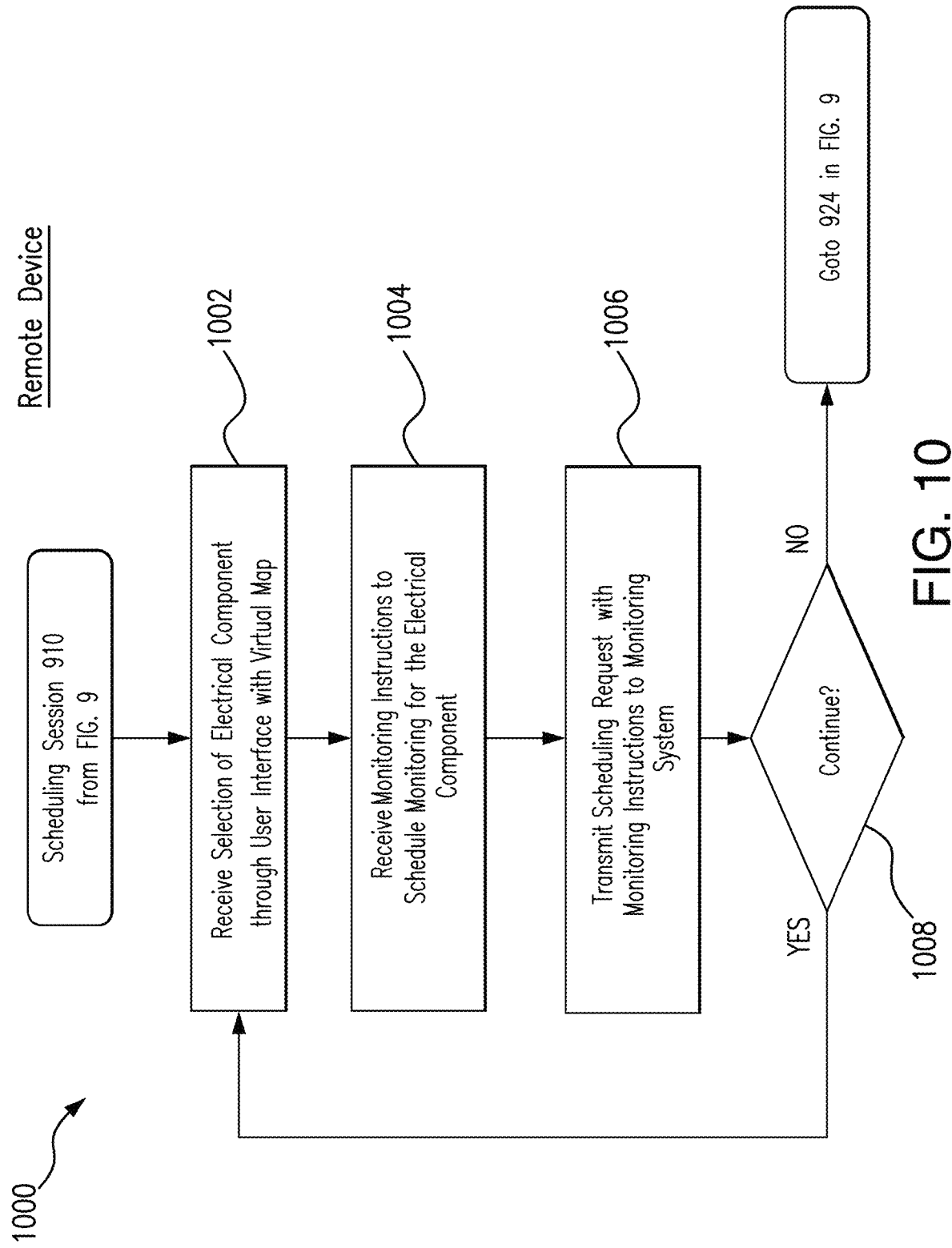
Figure 11:
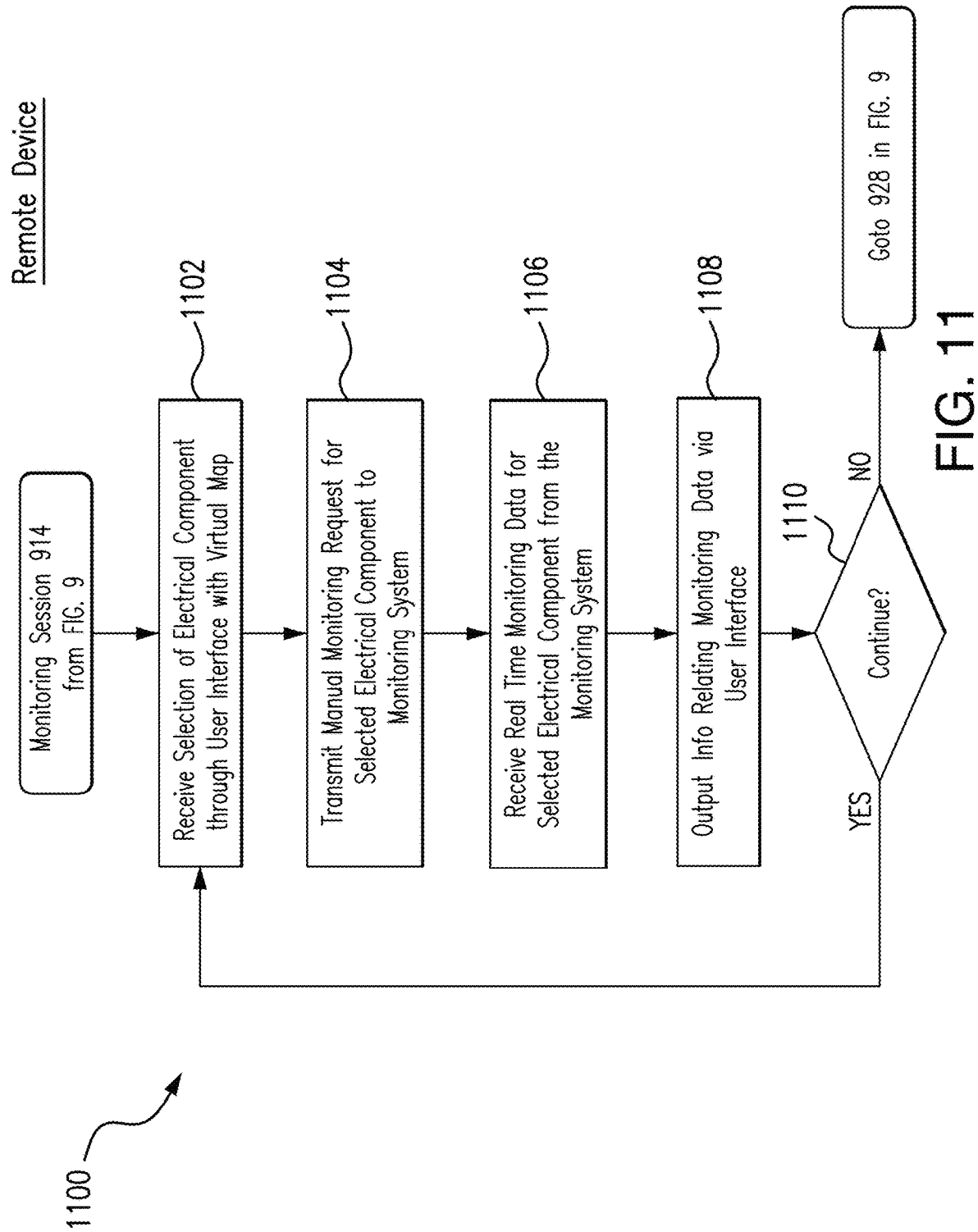

FIGS. 9, 10 and 11 illustrate exemplary processes implemented by a remote device, such as the remote device 50 shown in FIGS. 1, 2, 5A and 5B, to monitor and control power to electrical components inside of an electrical enclosure, via a remote controllable monitoring system such as the monitoring system 100 in FIG. 1. The various processes of the remote device can be implemented under control of a processor which interacts with other components of the remote device, such as a communication device, memory and/or input/output (I/O) devices.

FIG. 9 illustrates an example process 900 by which the remote device interacts with the monitoring system to remotely monitor electrical components of equipment housed inside of an electrical enclosure. As shown in FIG. 9, the process 900 begins at reference 902 in which the user can setup remote monitoring on the remote device for new electrical equipment or can update settings for existing monitored electrical equipment through the remote device. For example, the remote device can access and download new or updated layout data of the equipment from a remote system, such as a remote server, at a remote location. The layout data can include image(s) of the equipment (e.g., schematic or actual image). The layout data can also include identification information for the electrical components (e.g., component identifiers) and/or location information of electrical components (e.g., coordinates) of the equipment. The layout data is stored in memory, and used by the remote device to create a virtual map of the equipment and its electrical components for use in remote monitoring thereof. The electrical components shown on the virtual map are synchronized with the actual locations of the corresponding electrical components to be monitored inside of the electrical enclosure by the movable sensor assembly of the monitoring system.

Furthermore, the remote device can interact with the monitoring system to enable the user to perform setup operations for the monitoring system, such as the operations for a setup session previously described in regards to references 802-808 in FIG. 8.

As further shown in FIG. 9, at reference 904, the remote device selects equipment to be monitored from a plurality of equipment. For example, the user can select the particular equipment (e.g., load center #1, load center #2, etc.) for monitoring on the remote device, via the user interface. Alternatively, the remote device may select the particular equipment according to default or predefined settings.

At reference 906, the remote device provides an interactive user interface through its I/O devices (e.g., a touch screen). The user interface can display a menu of functions, a virtual map of electrical components of the selected equipment and other graphical information or input elements. The virtual map can be generated by accessing layout data for the selected equipment to be monitored. Through the user interface, the user can initiate a manual monitoring session for the selected equipment, make scheduling request(s) for scheduled monitoring session(s), receive monitoring data relating to sensed characteristic(s) of electrical component(s), control power to the electrical components, and add or update settings associated with the monitoring operations.

An example of the user interface is shown in FIGS. 5A and 5B, (previously described above).

At reference 908, the remote device determines whether the user wishes to schedule monitoring of the electrical components of the equipment. If so, the remote device initiates a scheduling session, in which the user can schedule monitoring for the electrical components with the monitoring system at reference 910. An example of the operations performed during a scheduling session is described below with reference to the process 1000 of FIG. 10. After the scheduling session is completed, the remote device determines whether the user wishes to continue with the process 900 at reference 928. For example, the remote device may check if the user has made a request to exit or end the monitoring activity. If so, the process 900 is terminated at reference 930. Otherwise, the process 900 returns back to reference 906, where the remote device awaits further action from the user through the user interface.

If the user has not requested a scheduling session at reference 908, the remote device determines whether the user has requested a manual monitoring session to conduct real time monitoring of the electrical components at reference 912. If so, the remote device implements the processes for a manual monitoring session accordingly at reference 914. For example, in the manual monitoring session, the user is able to navigate the virtual map, select any electrical component to monitor, and receive real time monitoring data (e.g., current sensed characteristics such as a current temperature, a live video feed of the component, a current status notification, etc.). An example of the operations for a manual monitoring session is described below with reference to process 1100 of FIG. 11. After the manual monitoring session is terminated by the user, the process 900 will proceed accordingly to reference 928 to determine whether the user wishes to continue or terminate the monitoring activity for the selected equipment.

If the user has not requested a manual monitoring session, the remote device determines whether it has received any new notifications, such as status notifications, from the monitoring system regarding any of the electrical components. If so, the remote device can output the new status notifications and, if desired, also output prior notifications. The remote device may highlight those electrical components on the virtual map with status notifications that are of a higher priority. For example, a higher priority status notification can provide warning of a detected abnormal state such as overheating or component malfunction. As such, the virtual map can identify "hot spot" warnings on the equipment, e.g., the electrical components that are overheating or in danger of overheating. The user may select any highlighted electrical component on the virtual map to receive specific information regarding the status notification, such as shown by the windows 590A in FIG. 5A and 590B in FIG. 5B. Thereafter, the process 900 proceeds to reference 928 to determine whether the user wishes to continue or terminate the monitoring activity.

If the remote device has not received any new notifications from the monitoring system at reference 916, the remote device determines whether the user wishes to interrupt power to the electrical components (e.g., turn OFF power) at reference 920. For example, the user may decide to interrupt power if one or more electrical components are operating abnormally. If the user decides to interrupt power, the remote device transmits a power down (PD) request to the monitoring system to interrupt power to the electrical components at reference 922. After the power is turned OFF to the electrical components by the monitoring system, the user can still access various monitoring functions on the remote device, such as scheduling session and manual monitoring session. The user can also view past notifications for any electrical component through the virtual map. At reference 924, the remote device determines whether the user wishes to connect or re-connect power to the electrical components (e.g., turn ON power). If so, the remote device transmits a power up (PU) request to the monitoring system to connect the power to the electrical components at reference 926. Thereafter, the process 900 proceeds to reference 928 to continue or terminate the monitoring activity.

If the remote device does not receive a user command to interrupt power at reference 920, the process 900 returns to reference 906 where the remote device awaits further action from the user through the user interface.

FIG. 10 illustrates an example process 1000 implemented by the remote device for a scheduling session, such as initiated at reference 910 in FIG. 9. At reference 1002, the remote device receives user selection of an electrical component from a plurality of electrical components via the user interface. For example, the user can select the electrical component on the virtual map of the user interface. At reference 1004, the remote device receives monitoring instructions for the selected electrical component from the user. The monitoring instructions can include a monitoring schedule for any or all of the electrical components, such as on a specific date and time, or periodically (e.g., daily, weekly, monthly, etc.). The monitoring instructions can also include notification settings, such as a status notification, for any or all of the electrical components. The notification settings may include predefined conditions (e.g., threshold or threshold range(s) for sensed characteristic(s)) for notifying the user of a status of the electrical component). The user interface can be configured with graphical input elements (e.g., text box or pull down box, etc.) to receive user commands for these and any other relevant monitoring parameters.

At reference 1006, the remote device transmits a scheduling request with the monitoring instructions to the monitoring system. At reference 1008, the remote device determines whether the scheduling session has been terminated. If not, the process 1000 returns to reference 1002, where the remote device awaits selection of another electrical component for scheduling. Otherwise, if the scheduling session has ended, the remote device proceeds to reference 928 of the monitoring process 900 in FIG. 9.

During a scheduling session, the user can set scheduled monitoring parameters for the electrical components individually or in groups.

FIG. 11 illustrates an example process 1100 implemented by the remote device for a manual monitoring session, such as initiated at reference 914 in FIG. 9.

As shown in FIG. 11, at reference 1102, the remote device receives a user selection of an electrical component, such as from the user interface with the virtual map. For example, the user can select the electrical component to be monitored on the virtual map. At reference 1104, the remote device transmits a manual request for monitoring the selected electrical component to the monitoring system. The manual request can include a component identifier for the selected electrical component to be monitored, location information (e.g., coordinates) to be monitored or any information that can be used by the monitoring system for controlling movement of the movable sensor to the appropriate monitoring location inside of an electrical enclosure.

At reference 1106, the remote device receives real time monitoring data related to the current sensed characteristic (s) for the selected electrical component from the monitoring system. As previously described, the monitoring data can include sensed characteristic(s) of the electrical component, and the current status of the electrical component (e.g., Abnormal, Normal, Overheating, etc.). The sensed characteristics can include a sensed temperature, an image or video feed, or other sensed physical or chemical properties of the electrical component. At reference, 1108, the remote device outputs information relating to the monitoring data, such as through the user interface. The image or video feed may be provided through a separate window through the user interface.

At reference 1110, the remote device determines whether the manual monitoring session has been terminated by the user. If not, the process 1100 returns back to reference 1102, where the remote device awaits for further user actions. Otherwise, if the monitoring session has been terminated, the process 1100 terminates and proceeds to reference 928 in FIG. 9.

During the monitoring session, the user may navigate from one electrical component to the next on the virtual map, and receive and evaluate real time monitoring data for the electrical components.

The various processes described with reference to FIGS. 6-11 are provided as examples of the various monitoring functions and operations, which can be performed by a monitoring system (e.g., 100 in FIG. 1) and a remote device (e.g., 50 in FIG. 1). The various operations described in these processes may be performed in different orders, and some of the operations may be combined or eliminated. The processes may also include other operations to facilitate remote monitoring of electrical components inside of an electrical enclosure.

Furthermore, the sensors arranged in the electrical enclosure can be moved using other motor-driven systems than shown in FIGS. 1, 3 and 4. For example, instead of the sensors moving on or along a frame (e.g., rails), the sensors can be moved using a motor-driven retractable mechanical arm mounted on an interior surface of an electrical enclosure. The mechanical arm can be configured to move the sensors in 2-D or 3-D space inside of an electrical enclosure. Alternatively, a pulley system can be used to move the sensors. Further, the sensor holder can also be configured to rotate (e.g., 180 degree rotation) in two axis in order to sense characteristics of the side of the electrical components, such as electromechanical connections. For example, the sensor holder can incorporate a motorized platform to rotate the sensors or the portion of the sensor holder that houses the sensors. Furthermore, the sensor holder, such as shown in FIG. 4, can incorporate different types of sensors or combination of sensors.

The monitoring system can stream images (e.g., video) of the equipment and its electrical components in real time to the remote device, or can record the images in a memory for transmission at a later time to the remote device. As previously discussed, the images can be taken by an image sensor, such as a video camera. Other types of image sensors may also be used in the monitoring system. For example, the movable sensors can also include a thermal imaging sensor. Individual or overlapping thermal images of electrical components of electrical equipment and their thermal gradient can also be streamed from the monitoring system in real time to the remote device or can be recorded and transmitted at a later time.

The monitoring system has also been described with reference to a load center or panelboard, but can also be incorporated into other types of enclosed electrical device(s) or system(s) such enclosed circuit breakers, enclosed drives, motor control center (MCC), switchboards, and so forth.

In addition, words of degree, such as "about", "substantially", and the like are used herein in the sense of "at, or nearly at, when given the manufacturing, design, and material tolerances inherent in the stated circumstances" and are used to prevent the unscrupulous infringer from unfairly taking advantage of the invention disclosure where exact or absolute figures and operational or structural relationships are stated as an aid to understanding the invention.

While particular embodiments and applications of the present disclosure have been illustrated and described, it is to be understood that the present disclosure is not limited to the precise construction and compositions disclosed herein and that various modifications, changes, and variations can be apparent from the foregoing descriptions without departing from the invention.

The invention claimed is:

1. A method of monitoring electrical components arranged at different locations inside of an electrical enclosure for enclosing power distribution equipment, the method comprising:
   receiving a request from a remote device to monitor a selected electrical component from a plurality of electrical components inside the electrical enclosure, the remote device providing an interactive user interface with a virtual map of the plurality of electrical components inside of the electrical enclosure, the selected electrical component being selected for monitoring by a user from the plurality of electrical components displayed on the virtual map through the interactive user interface on the remote device, a layout of the plurality of electrical components on the virtual map being synchronized to actual locations of the plurality of electrical components in the electrical enclosure;
   moving a movable sensor inside the enclosure to a location relative to the location of the selected electrical component to be monitored according to the request, the movable sensor being movably mounted inside of the electrical enclosure;
   monitoring the selected electrical component with the movable sensor to sense a characteristic of the electrical component;
   transmitting real-time monitoring data relating to the sensed characteristic of the selected electrical component to the remote device.

2. The method of claim 1, wherein the plurality of electrical components comprises components of a panelboard or residential load center.

3. The method of claim 1, further comprising:
   accessing layout data identifying locations of the plurality of electrical components inside the electrical enclosure, wherein the movable sensor is moved inside the enclosure to the location relative to the location of the electrical component to be monitored according to the layout data and the request.

4. The method of claim 1, wherein the request is a manual request to monitor the electrical component in real time.

5. The method of claim 1, wherein the request is a scheduling request to schedule monitoring of the electric component, wherein the movable sensor is moved inside of the electrical enclosure to monitor the electrical component according to the scheduling request.

6. The method of claim 5, wherein the scheduling request includes a notification setting for notifying the remote device of a status of the electrical component when a predefined condition is detected based on the sensed characteristic of the electrical component.

7. The method of claim 1, further comprising:
storing notification settings for notifying the remote device of a status of the electrical component when a predefined condition is detected based on a sensed characteristic of the electrical component; and
transmitting a notification of the status of the electrical component if the sensed characteristic of the electrical component satisfies the predefined condition.

8. The method of claim 1, wherein the movable sensor includes a temperature sensor and an image sensor, the monitoring operation comprising:
capturing an image of the electrical component via the image sensor; and
sensing a temperature of the electrical component via the temperature sensor.

9. The method of claim 8, wherein the captured image is a live video of the electrical component, and the monitoring data includes a feed of the live video and information relating to the sensed temperature of the electrical component.

10. The method of claim 1, wherein the request includes position or identification information of the electrical component to be monitored corresponding to a user selection on the virtual map from the interactive user interface, the movable sensor being moved to a location relative to the electrical component according to the position or identification information.

11. The method of claim 1, wherein the movable sensor device is movable in a two-dimensional space inside the electrical enclosure.

12. The method of claim 1, wherein the movable sensor is held by a sensor holder which is configured to move along or on a frame that is mounted inside of the electrical enclosure, the frame including one or more frame assemblies to move the sensor holder in one or more directions within the electrical enclosure.

13. The method of claim 1, further comprising:
interrupting power to the plurality of electrical components in response to a power down request from the remote device.

14. The method of claim 1, wherein the remote device comprises a portable user device.

15. A remote controllable monitoring system for monitoring electrical components arranged at different locations inside of an electrical enclosure for enclosing power distribution equipment, the remote controllable monitoring system comprising:
a communication device to communicate with a remote device outside of the electrical enclosure;
a movable sensor movably mounted inside the electrical enclosure; and
a processor, which interacts with the communication device and the movable sensor, to:
receive a request from a remote device to monitor an electrical component from a plurality of electrical components inside the electrical enclosure, the remote device providing an interactive user interface with a virtual map of the electrical components inside of the electrical enclosure, the selected electrical component being selected for monitoring by a user from the plurality of electrical components displayed on the virtual map through the interactive user interface on the remote device, a layout of the plurality of electrical components on the virtual map being synchronized to actual locations of the plurality of electrical components in the electrical enclosure;
control movement of a movable sensor inside the enclosure to a location relative to the location of the selected electrical component to be monitored according to the request, the movable sensor being movably mounted inside of the electrical enclosure;
monitor the selected electrical component with the movable sensor to sense a characteristic of the electrical component;
transmit real-time monitoring data relating to the sensed characteristic of the electrical component to the remote device.

16. The remote controllable monitoring system of claim 15, wherein the request is a manual request to monitor the electrical component in real time or a scheduling request to schedule monitoring of the electrical components.

17. The remote controllable monitoring system of claim 15, wherein the movable sensor is held by a sensor holder which is configured to move along or on a frame that is mounted inside of the electrical enclosure, the frame including one or more frame assemblies to move the sensor holder in one or more directions within the electrical enclosure.

18. A method of remotely controlling a remote controllable monitoring system to monitor electrical components arranged at different locations inside of an electrical enclosure for enclosing power distribution equipment, the remote controllable monitoring system including a movable sensor movably mounted inside of the electrical enclosure, the method comprising:
providing an interactive user interface with a virtual map of a plurality of electrical components inside of the electrical enclosure, a layout of the plurality of electrical components on the virtual map being synchronized to actual locations of the plurality of electrical components in the electrical enclosure;
transmitting to the remote controllable monitoring system, via a communication device, a manual request to monitor in real time a selected electrical component from a plurality of electrical components housed inside of the electrical enclosure, the selected electrical component being selected for monitoring by a user from the plurality of electrical components displayed on the virtual map through the interactive user interface;
receiving, via the communication device, real time monitoring data from the remote controllable monitoring system in response to the manual request, the monitoring data relating to a characteristic of the selected electrical component sensed by the movable sensor;
outputting, via the user interface, information relating to the monitoring data for the selected electrical component.

19. The method of claim 18, further comprising:
downloading layout data of the electrical components inside of the electrical enclosure from a remote location, the data being used to generate the virtual map of the interactive user interface.

20. The method of claim 19, wherein the layout data includes images of the electrical components, component identifiers identifying electrical components, and location information identifying the electrical components of equipment inside of the electrical enclosure.

21. The method of claim 18, further comprising:
selecting, via the virtual map of the interactive user interface, an electrical component from the plurality of electrical components to monitor in real time.

22. The method of claim 18, wherein the movable sensor includes a temperature sensor and an image sensor, the monitoring data including a live video feed of the electrical component sensed by the image sensor and information relating to a temperature of the electrical component sensed by the temperature sensor.

23. The method of claim 18, further comprising:
identifying the electrical components that are overheating or in danger of overheating on the virtual map.

24. The method of claim 18, wherein the movable sensor is held by a sensor holder which is configured to move along or on a frame that is mounted inside of the electrical enclosure, the frame including one or more frame assemblies to move the sensor holder in one or more directions within the electrical enclosure.

* * * * *